United States Patent [19]

Nakamura et al.

[11] Patent Number: 4,832,810
[45] Date of Patent: May 23, 1989

[54] CO-BASED ALLOY SPUTTER TARGET AND PROCESS OF MANUFACTURING THE SAME

[75] Inventors: Kyuzo Nakamura; Yoshifumi Ota, both of Yachimata; Taiki Yamada, Narita; Michio Ishikawa, Yachimata; Noriaki Tani, Yachimata; Yasushi Higuchi, Yachimata, all of Japan

[73] Assignee: Nihon Shinku Gijutsu Kabushiki Kaisha, Kanagawa, Japan

[21] Appl. No.: 70,441

[22] Filed: Jul. 7, 1987

[30] Foreign Application Priority Data

Jul. 8, 1986 [JP] Japan ................................. 61-158755

[51] Int. Cl.$^4$ ............................................. C23C 14/00
[52] U.S. Cl. ................................ 204/192.15; 148/425; 148/313; 204/298
[58] Field of Search ......................... 204/298, 192.15; 148/11.5 N, 425

[56] References Cited

U.S. PATENT DOCUMENTS

| | | | |
|---|---|---|---|
| 3,356,542 | 12/1967 | Smith | 148/11.5 N |
| 3,390,443 | 7/1968 | Gould et al. | 148/11.5 N |
| 3,494,807 | 2/1970 | Stuart et al. | 148/11.5 |
| 3,695,944 | 12/1972 | Stroble | 148/11.5 N |
| 4,414,087 | 11/1983 | Meckel | 204/192.15 |

FOREIGN PATENT DOCUMENTS 0054269 6/1982 European Pat. Off. .

OTHER PUBLICATIONS

Thornton, Zeitschrift Fur Metallkunde, vol. 75, No. 11, Nov. 1984, pp. 847–854.
Patent Abstracts of Japan, vol. 9, No. 121 (M-383) [1844], May 25, 1985.

Primary Examiner—Donald L. Walton
Attorney, Agent, or Firm—Armstrong, Nikaido, Marmelstein & Kubovcik

[57] ABSTRACT

A Co-based alloy sputter target comprising a f.c.c. phase and a h.c.p. phase, wherein the value of th ratio of X-ray diffraction peak intensity, $I_{fcc(200)}/I_{hcp(101)}$, is smaller than the value of the same ratio in a Co-based alloy obtained by cooling a Co-based alloy having a f.c.c. single phase to room temperature from the high temperature at which it is in a melted state.

The target is manufactured by subjecting to cold-working treatment a Co-based alloy obtained by cooling a Co-based alloy material having a f.c.c. single phase from its melting temperature.

6 Claims, 2 Drawing Sheets

CO-BASED ALLOY SPUTTER TARGET AND PROCESS OF MANUFACTURING THE SAME

This invention relates to a Co-based alloy target for use in vapor deposition of metallic films by sputtering, such as magnetron sputtering.

BACKGROUND OF THE INVENTION

A conventional Co-based alloy sputter target hitherto used comprises in part a hexagonal close packing (h.c.p.) phase, the remainder being a phase which is largely face centered cubic (f.c.c.) with a smaller amount of h.c.p. This conventional target is manufactured by a process wherein a Co-based alloy material comprising a single f.c.c. phase is heated until it is melted, and is then poured into a mould and is cooled from the high temperature at which it is in the f.c.c. single phase. The resulting molded alloy is allowed to cool immediately or after it is subjected to a hot-working treatment, so that part of the f.c.c. single phase is transformed into a Martensite structure which includes a h.c.p. phase. The conventional Co-based alloy thus manufactured has been used for magnetron sputtering.

SUMMARY OF THE INVENTION

An object of this invention is to provide a Co-based alloy sputter target material characterized by a value of the ratio of the face centered cubic phase to the hexagonal close packed phase which is smaller than the value of the same ratio in a conventional Co-based sputter target.

Another object of this invention is to provide a method for manufacturing the Co-based alloy of this invention.

DESCRIPTION OF THE INVENTION

Figure 1:
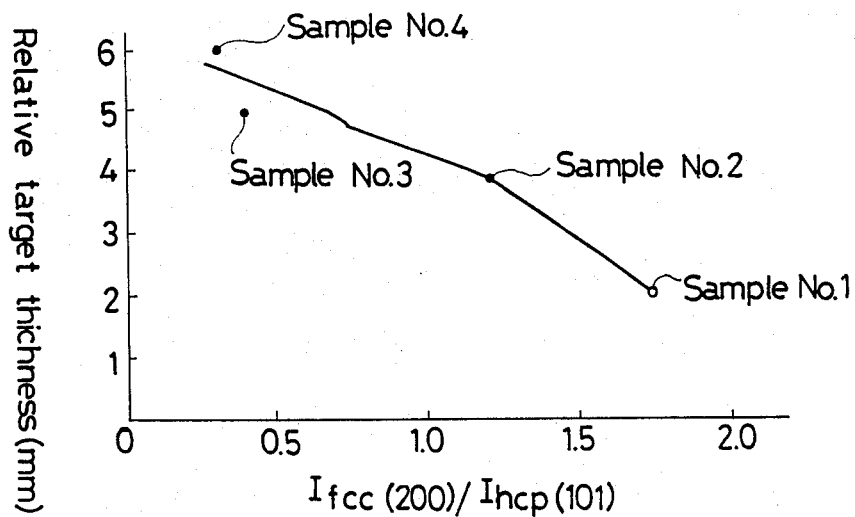
FIG. 1 is a graph showing the relationship between the ratio of X-ray diffraction peak intensity, $I_{fcc(200)}/I_{hcp(101)}$, of a Co-based alloy sputter target and its thickness.

Magnetron sputtering is carried out in such a manner that a leakage magnetic field is created on and over the surface of the target so that the resulting plasma is concentrated on the surface of the target. When a magnetic substance such as the conventional Co-based alloy described above is used as a target, the magnetic flux tends to pass through the interior of the target. Therefore, in order to localize the leakage field on the surface of the target, it has been necessary to reduce the thickness of the target, thus reducing its saturation magnetization.

The conventional Co-based alloy sputter target described above is thin and consequently has shortcomings such as a relatively short service life. Furthermore, in the progress of erosion of the conventional target, the magnetic field in the eroded recessed portion is increased, so that the plasma is concentrated onto the eroded portion. Thus the target is locally consumed, resulting in a poor utilization factor.

Accordingly, it is desirable to make possible the use of a Co-based alloy sputter target which is thicker than the conventional Co-based alloy sputter target. With this goal, the inventors conducted studies and research on the relationship between the magnetic properties of a Co-based alloy sputter target and the surface leakage magnetic field, the erosion shapes or other factors. As a result, the inventors have discovered that, contrary to conventional thought, the generation of the surface leakage field depends on the target material, specifically on the permeability of the target material. On the basis of these findings, it has been confirmed that even a Co-based alloy which has a large saturation magnetization can have a small permeability. Therefore, the surface leakage magnetic field around this Co-based alloy can be strengthened.

The inventors have also found that, in the case of a Co-based alloy, the ratio of the f.c.c. phase to the h.c.p. phase has significant influence on the magnitude of the permeability. Namely, it was found that the h.c.p. phase of the Co-based alloy has a very large crystal magnetic anisotropy, whereas the f.c.c. phase has a small crystal magnetic anisotropy. Consequently, if the amount of the h.c.p. phase is increased, the permeability of the Co-based alloy is decreased, and it is easier to generate the leakage magnetic field on the surface of the target. Further, the inventors found that if the amount of elements such as Ni, Cr, Pt, W, V, Ti or the like which are added to Co in the Co-based alloy is increased, the permeability of the Co-based alloy is decreased and accordingly it is easier to generate a leakage magnetic field around the Co-based alloy, in spite of the fact that its saturation magnetization is decreased.

If it were possible to decrease the f.c.c. phase of the Co-based alloy sputter target manufactured by the conventional process, and to increase its h.c.p. phase so that the ratio of the f.c.c. phase to the h.c.p. phase is decreased, then the permeability of the target could be decreased, resulting in increase in generation of the leakage magnetic field on the surface of the target. This means that a Co-based alloy which is thicker than the conventional Co-based alloy could be used, resulting in prolongation of the service life and improvement in the utilization efficiency. Also, if the Co-based alloy having a smaller ratio of the f.c.c. phase to the h.c.p. phase is used in a thickness equal to the thickness of the conventional Co-based alloy, there would be brought about reduction in the size of the magnetic generation apparatus and savings in consumption of electric power.

In practice, it is difficult to obtain the ratio of the f.c.c. phase to the h.c.p. phase of the Co-based alloy by volume measurement. Therefore, the inventors considered obtaining a ratio of the intensity of X-ray diffraction peaks which would be proportional to the volumetric ratio of the two phases. In this case, the X-ray diffraction peaks corresponding to the f.c.c. phase and the X-ray diffraction peaks corresponding to the h.c.p. phase are overlapped with each other. However, the X-ray diffraction peak in the (200) face in the f.c.c. phase and the X-ray diffraction peak in the (101) face in the h.c.p. phase are not overlapped with each other. Therefore, the ratio of the intensity of those two peaks, that is, $I_{fcc(200)}/I_{hcp(101)}$, is measured, and the mixing ratio of the two phases can be obtained therefrom.

The inventors have developed a process for manufacturing a Co-based alloy sputter target which is characterized by a ratio of the X-ray diffraction peak intensity for the f.c.c. phase to the X-ray diffraction peak intensity for the h.c.p. phase which is smaller than in the conventional Co-based alloy sputter target manufactured by the conventional process. The process of this invention comprises the steps of manufacturing a conventional Co-based alloy by heating a Co-based alloy material having a f.c.c. single phase until it is melted, and then pouring it into a mould and allowing it to cool from the high temperature at which is it in the f.c.c. phase. In carrying out this cooling, the resultant molded alloy is cooled to room temperature upon standing, or in the alternative, the alloy is first subjected to a hot-working treatment and then allowed to cool to room temperature upon standing, so that part of the f.c.c. single phase is transformed into a Martensite structure comprising a h.c.p. phase. Then, in the second stage of the process of this invention, the resultant Co-based alloy comprising a h.c.p. phase and a f.c.c. phase is subjected to a cold-working treatment. As a result of the cold-working, a compression strain is imparted to the Co-based alloy, and additionally, a part of the f.c.c. phase which is still present in the Co-based alloy prior to the cold-working treatment is transformed into a Martensite structure comprising a h.c.p. phase.

As the cold-working means, any of the conventional methods such as rolling, drawing, swagging, forging, general press working, may be used. It is preferable that the Co-based alloy is cold-worked until its compression ratio is about 5% or more.

In summary, the Co-based alloy sputter target of this invention is characterized by a ratio of the X-ray diffraction peak intensity, $I_{fcc(200)}/I_{hcp(101)}$, which is smaller than the corresponding ratio in a conventional Co-based alloy which has not been subjected to a cold-working treatment. Accordingly, this invention provides a Co-based alloy sputter target which has a reduced permeability corresponding to the smaller value of the ratio of X-ray diffraction peak intensity, $I_{fcc(200)}/I_{hcp(101)}$. Thus, the foregoing drawbacks of the conventional Co-based alloy sputter target are not found in the improved Co-based alloy sputter target of this invention. It is possible to use the Co-based alloy sputter target of this invention in a thickness which is greater than in the conventional Co-based alloy target. With such increased thickness, the service life of the target is longer and its utilization efficiency is improved as compared with the conventional Co-based alloy target. Namely, the ratio of the f.c.c. phase to the h.c.p. phase in the Co-based alloy of this invention is smaller than in the conventional Co-based alloy, resulting in a reduced permeability. Therefore, generation of the surface leakage magnetic field localized around the target can be achieved more easily. Under these conditions, the sputter target can be made thicker, and its utilization efficiency is increased by a corresponding amount.

Embodying examples of this invention, together with comparison examples, are described below.

As the Co-based alloy material, any alloy prepared by using Co metal as a base material and mixing therein at least one additional metal, such as Ni, Cr, Pt, W, or other metals, may be used. According to the process of this invention, the Co-based alloy which has a f.c.c. single phase is heated to a high temperature until it is melted. The melted alloy is poured into a mould and allowed to cool to room temperature. In the alternative, before cooling the melted alloy to room temperature, the solidified alloy which is still hot is subjected to a hot-working treatment and pressed into a sheet of a given width, and the resultant sheet is cooled to room temperature. In any case, in the cooling process, a part of the f.c.c. phase in the alloy is transformed into a h.c.p. phase, that is, a Martensite structure. The resultant Co-based alloy comprising a h.c.p. phase and a f.c.c phase is a conventional product. In the following Table 1, the conventional Co-based sputter targets manufactured by the foregoing process are Sample No. 1 having the composition 70at. %Co—20at. %Ni—10at. %Cr, Sample No. 5 having the composition 84at. %Co—16at. %Cr, Sample No. 7 having the composition 70at. %Co—20at. %Ni—10at. %Pt, and Sample No. 9 having the composition 75at. %Co—25at. %Ni. The respective values of the ratio of X-ray diffraction peak intensity, $I_{fcc(200)}/I_{hcp(101)}$, for these conventional Co-based alloys were 1.75, 1.90, 1.65 and 2.03.

According to this invention, the foregoing respective conventional Co-based alloys were subjected to a cold-rolling treatment. By the cold-working treatment, those samples were compressed so that their respective sectional area compression ratios were 5% or more, as shown in Table 1. As a result, the cold-worked Co-based alloy sputter targets of this invention were obtained (Samples No. 2, 3, 4, 6, 8 and 10 in Table 1). When the ratio of the X-ray diffraction peak intensity, $I_{fcc(200)}/I_{hcp(101)}$, of the products of this invention is compared to the ratio in the conventional samples, it is seen that the intensity ratio is lowered by the cold-working treatment, and that the extent of lowering of this ratio increases as the compression ratio is increased.

The ratio of X-ray diffraction peak intensity was lowered from 1.75 (in conventional product Sample No. 1) to 1.21 in Sample No. 2 which is cold-worked according to the method of this invention under the condition of 5% sectional area compression ratio. Further, as the sectional area compression ratio is increased to 10%, and 15%, the intensity ratio was lowered to 0.39 and 0.30, respectively, (Sample No. 3 and Sample No. 4). Similarly, the respective intensity ratios of the conventional Samples No. 5, No. 7 and No. 9 were lowered by being subjected to the cold-working treatment. The intensity ratio was lowered from 1.90 in Sample No. 5 to 0.45 in Sample No. 6, from 1.65 in Sample No. 7 to 0.35 in Sample No. 8, and from 2.03 in Sample No. 9 to 0.42 in Sample No. 10. Thus, it was confirmed that the ratio of the X-ray diffraction peak intensity, $I_{fcc(200)}/I_{hcp(101)}$, of the conventional Co-based alloy product is lowered by applying the cold-working treatment to the product, and also that the compression ratio of the product of this invention is increased as the value of the intensity ratio is lowered.

The intensity ratio and the permeability of each of the foregoing samples were measured with slices of the samples which had been treated with aqua regia.

The results of the measurements of permeability are shown in Table 1. It was confirmed therefrom that the permeability of the conventional samples was lowered remarkably by the cold-working treatment.

The target properties of the respective samples were examined by using a D.C. magnetron cathode having the dimensions of 5 inches×8 inches. The results are shown in Table 1 wherein the term "relative target thickness" refers to the thickness of a target upon the surface of which a leakage magnetic field of 250 G is generated when the sample of target is placed on the cathode, and a parallel magnetic field of 600 G is applied, such parallel magnetic field being measured at the midpoint between the magnetic poles in the magnetron.

From the values of the relative thicknesses of the respective samples shown in Table 1, it is clear that the respective Co-based alloy targets which were cold-worked according to this invention can be made remarkably thicker than the corresponding respective conventional Co-based alloy targets which were not cold-worked.

The target utilization efficiency of the respective target samples was examined in target samples each having a thickness of 5 mm. The cathode was adjusted so that the surface leakage magnetic field was 250 G, and under those conditions, a sputtering process was then carried out during which the plasma used is concentrated on the cavity of the eroded area of the target. Thus the target was locally eroded, and when the thickness of the maximum eroded part reached zero "0", the sputtering process was stopped, and the amount of the target which was used up was measured. The results are shown in Table 1. It can be appreciated therefrom that the utilization efficiency of the cold-worked targets of this invention was remarkably improved as compared with the utilization efficiency of the targets which had not been subjected to cold-working treatments.

Figure 2:
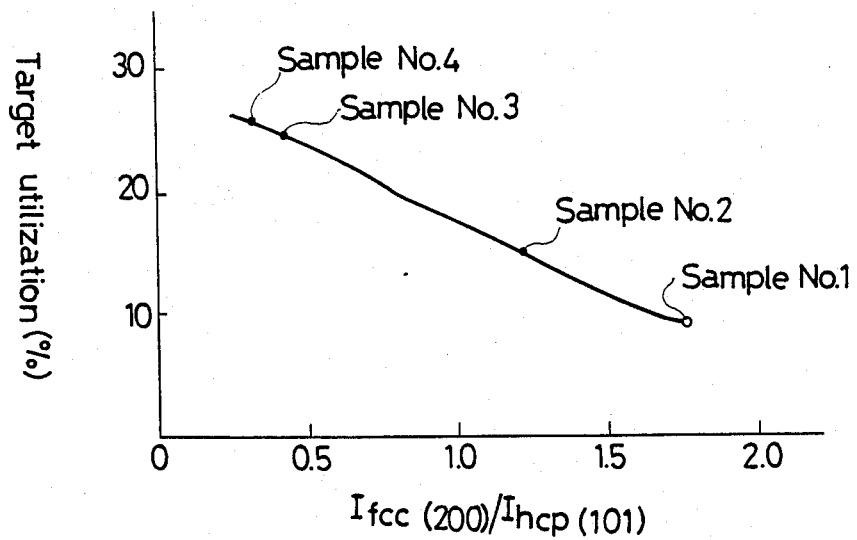
FIG. 2 is a graph showing the relationship between the ratio of X-ray diffraction peak intensity and the utilization efficiency.

FIG. 1 and FIG. 2 show the relationship of the ratio of X-ray diffraction peak intensity, $I_{fcc(200)}/I_{hcp(101)}$, to the relative target thickness, and to the target utilization efficiency, respectively, in the typical example of a target having the composition 70at. %Co—20at. %Ni—10at. %Cr. It can be appreciated from FIGS. 1 and 2 that both the target thickness and the target utilization efficiency increase as the intensity ratio decrease.

TABLE 1

| No. | Sample | Target composition | Sectional-area compression ratio by cold-working (%) | X-ray diffraction peak intensity ratio, $I_{fcc(200)}/I_{hcp(101)}$ | Permeability | Relative target thickness (mm) | Target utilization efficiency (%) |
|---|---|---|---|---|---|---|---|
| 1 | Conventional product | 70 at. % Co—20 at. % Ni—10 at. % Cr | 0 | 1.75 | 15 | 2 | 9 |
| 2 | This invention | 70 at. % Co—20 at. % Ni—10 at. % Cr | 5 | 1.21 | 10 | 4 | 14 |
| 3 | This invention | 70 at. % Co—20 at. % Ni—10 at. % Cr | 10 | 0.39 | 8 | 5 | 24 |
| 4 | This invention | 70 at. % Co—20 at. % Ni—10 at. % Cr | 15 | 0.30 | 6 | 6 | 25 |
| 5 | Conventional product | 84 at. % Co—16 at. % Cr | 0 | 1.90 | 15 | 2 | 10 |
| 6 | This invention | 84 at. % Co—16 at. % Cr | 10 | 0.45 | 6 | 5 | 25 |
| 7 | Conventional product | 70 at. % Co—20 at. % Ni—10 at. % Pt | 0 | 1.65 | 17 | 2 | 9 |
| 8 | This invention | 70 at. % Co—20 at. % Ni—10 at. % Pt | 15 | 0.35 | 6 | 6 | 23 |
| 9 | Conventional product | 75 at. % Co—25 at. % Ni | 0 | 2.03 | 20 | 1 | 7 |
| 10 | This invention | 75 at. % Co—25 at. % Ni | 15 | 0.42 | 7 | 5 | 24 |

Figure 3:
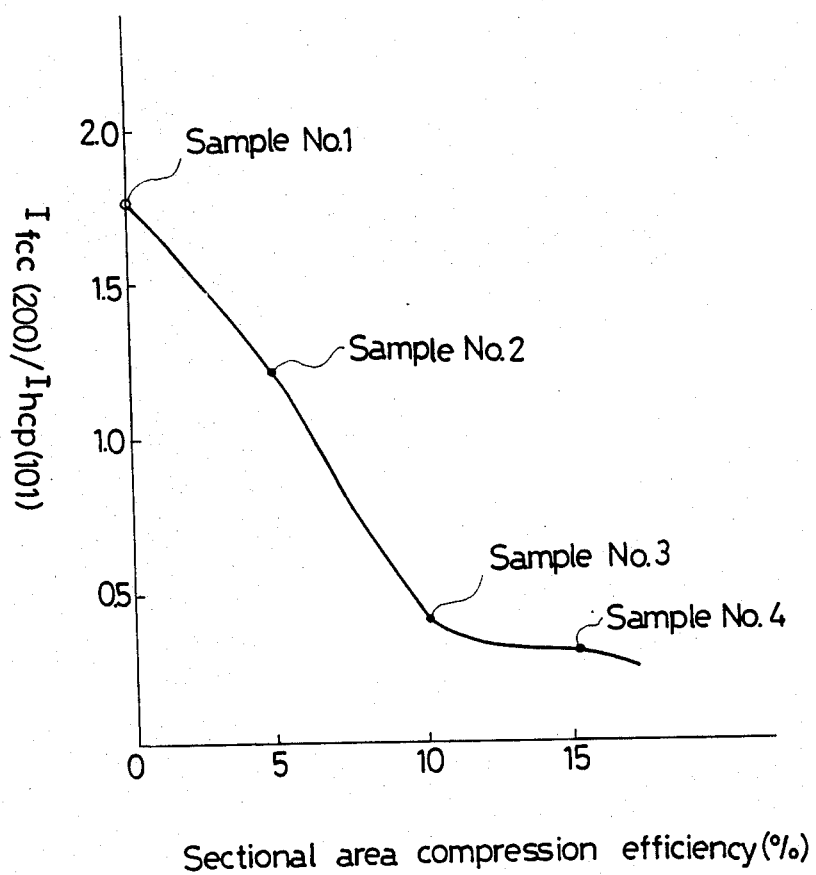
FIG. 3 is a graph showing the relationship between the ratio of X-ray diffraction peak intensity and the cross-sectional area compression ratio.

FIG. 3 shows the relationship of the ratio of X-ray diffraction peak intensity, $I_{fcc(200)}/I_{hcp(101)}$, to the sectional-area compression ratio of the target in the typical case of a target having the composition 70at. %Co—20at. %Ni—10at. %Cr. It is seen from FIG. 3 that the intensity ratio decreases as the compression ratio increases.

The foregoing embodying examples have been explained in the context of their use in D.C. magnetron sputtering. However, this invention can be adapted to any desired sputtering process of the type wherein the plasma is controlled by using the magnetic field of a R.F. magnetron, a coaxial magnetron, a triode magnetron or the like.

We claim:

1. A magnetron sputter target obtained by forming a modified Co-based alloy into a magnetron sputter target shape, said modified Co-based alloy being a Co-based alloy which comprises a face centered cubic phase and a hexagonal close packed phase, wherein the value of the ratio of the intensity of the X-ray diffraction peak for the (200) face of the face centered cubic phase to the intensity of the X-ray diffraction peak for the (101) face of the hexagonal close packed phase, $I_{fcc(200)}/I_{hcp(101)}$, is smaller than the value of the same ratio in an unmodified Co-based alloy which is obtained by cooling to room temperature a Co-based alloy material having a face centered cubic single phase from its melting temperature.

2. A magnetron sputter target as in claim 1, wherein the difference between the value of the ratio $I_{fcc(200)}/I_{hcp(101)}$ in said unmodified Co-based alloy and the value of the same ratio in said modified Co-based alloy is in the range of 1.30–1.61.

3. A magnetron sputter target obtained by forming a modified Co-based alloy into a magnetron sputter target shape, said modified Co-based alloy being a Co-based alloy which comprises a face centered cubic phase and a hexagonal close packed phase, wherein the value of the ratio of the intensity of the X-ray diffraction peak for the (200) face of the face centered cubic phase to the intensity of the X-ray diffraction peak for the (101) face of the hexagonal close packed phase, $I_{fcc(200)}/I_{hcp(101)}$, is smaller than the value of the same ratio in an unmodified Co-based alloy which is obtained by cooling to room temperature a Co-based alloy material having a face centered cubic single phase from its melting temperature, and wherein the magnetic permeability of said modified Co-based alloy is smaller than the magnetic permeability of said unmodified Co-based alloy.

4. A magnetron sputter target as in claim 3, wherein the difference between the value of the ratio $I_{fcc(200)}/I_{hcp(101)}$ in said unmodified Co-based alloy and the value of the same ratio in said modified Co-based alloy is in the range of 1.30–1.61.

5. A method for depositing a metallic film on a substrate, comprising the step of conducting magnetron sputtering with a magnetron sputtering target which consists essentially of a modified Co-based alloy comprising a face centered cubic phase and a hexagonal close packed phase, wherein the value of the ratio of the intensity of the X-ray diffraction peak for the (200) face of the face centered cubic phase to the intensity of the X-ray diffraction peak for the (101) face of the hexagonal close packed phase, $I_{fcc(200)}/I_{hcp(101)}$, is smaller than the value of the same ratio in an unmodified Co-based alloy which is obtained by cooling to room temperature a Co-based alloy material having a face centered cubic single phase from its melting temperature.

6. A method as in claim 5, wherein the difference between the value of the ratio $I_{fcc(200)}/I_{hcp(101)}$ in said unmodified Co-based alloy and the value of the same ratio in said modified Co-based alloy is in the range of 1.30–1.61.

* * * * *